United States Patent [19]
Hathaway

[11] Patent Number: 5,740,067
[45] Date of Patent: Apr. 14, 1998

[54] METHOD FOR CLOCK SKEW COST CALCULATION

[75] Inventor: David James Hathaway, Underhill Center, Vt.

[73] Assignee: International Business Machines Corporation, Armonk, N.Y.

[21] Appl. No.: 547,686

[22] Filed: Oct. 19, 1995

[51] Int. Cl.$^6$ .................................................. G06F 17/50
[52] U.S. Cl. .......................................... 364/489; 364/488
[58] Field of Search ............................... 364/488, 489, 364/490, 578

[56] References Cited

U.S. PATENT DOCUMENTS

| | | | |
|---|---|---|---|
| 3,654,615 | 4/1972 | Freitag ..................... | 340/172.5 |
| 4,495,559 | 1/1985 | Gelatt, Jr. et al. .......... | 364/148 |
| 4,607,339 | 8/1986 | Davis ....................... | 364/491 |
| 4,615,010 | 9/1986 | Davis et al. ................ | 364/491 |
| 4,931,944 | 6/1990 | Richter et al. .............. | 364/468 |
| 5,077,676 | 12/1991 | Johnson et al. ............. | 364/489 |
| 5,159,682 | 10/1992 | Toyonaga et al. ........... | 395/500 |
| 5,200,908 | 4/1993 | Date et al. ................ | 364/491 |
| 5,218,551 | 6/1993 | Agrawal et al. ............ | 364/491 |
| 5,224,056 | 6/1993 | Chene et al. ............... | 364/490 |
| 5,225,991 | 7/1993 | Dougherty .................. | 364/491 |
| 5,235,521 | 8/1993 | Johnson et al. ............. | 364/489 |
| 5,237,514 | 8/1993 | Curtin ...................... | 364/490 |
| 5,308,798 | 5/1994 | Brasen et al. .............. | 437/250 |
| 5,333,032 | 7/1994 | Matsumoto et al. .......... | 364/489 |
| 5,339,253 | 8/1994 | Carrig et al. .............. | 364/489 |
| 5,349,536 | 9/1994 | Ashtaputre et al. .......... | 364/491 |
| 5,359,535 | 10/1994 | Djaja et al. ............... | 364/489 |
| 5,363,313 | 11/1994 | Lee ......................... | 364/491 |
| 5,388,055 | 2/1995 | Tanizawa et al. ............ | 364/489 |
| 5,402,357 | 3/1995 | Schaefer et al. ............ | 364/490 |
| 5,410,491 | 4/1995 | Minami ..................... | 364/489 |
| 5,416,718 | 5/1995 | Yamazaki ................... | 364/488 |
| 5,508,937 | 4/1996 | Abato et al. ............... | 364/488 |
| 5,557,779 | 9/1996 | Minami ..................... | 364/489 |

OTHER PUBLICATIONS

Kudoh, M., et al., LSI Low Power Oriented Layout Method with Net Switching Factors, *IBM Technical Disclosure Bulletin*, Jun. 1993, vol. 36, No. 06B, pp. 505–507.

Gonsalves, G. J., Technology Mapping Using Simulated Annealing, *IBM Technical Disclosure Bulletin*, Aug. 1990, vol. 33, No. 3A, p. 308.

Author Unknown, Method to Achieve Equal Capacitance on a Group of Nets During Circuit Layout and Placement, *Research Disclosure*, Mar. 1989, No. 299, Kenneth Mason Publications Ltd., England.

Lam, Jimmy, et al., Performance of a New Annealing Schedule, *IEEE*, 1988 pp. 306–311.

Darema–Rogers, F., et al., Parallel Simulated Annealing Method for Highly Parallel Multiple Computer Processors, *IBM Technical Disclosure Bulletin*, Dec. 1987, vol. 30, No. 7 pp. 106–107.

Huang, M. D., et al., An Efficient General Cooling Schedule for Simulated Annealing, *IEEE*, 1986, pp. 381–384.

Kirkpatrick, S., et al., Optimization by Simulated Annealing, *Science*, May 13, 1983, vol. 220, No. 4598, pp. 671–680.

*Primary Examiner*—Vincent N. Trans
*Attorney, Agent, or Firm*—Schmeiser, Olsen & Watts; Richard Kotulak, Esq.

[57] ABSTRACT

The present invention provides a method of computing the cost of a proposed clock tree change in the context of a clock skew optimization routine. According to the present invention, a recalculation of the clock skew cost due to a proposed change in the clock tree can be done without having to recompute the effect of the change to all of the sinks of that clock tree. The method stores the effects of past delay changes as unpropagated incremental changes until future changes make it necessary to propagate those changes. Thus, in this method only the parameters of the ancestors of the delayed node need to be recalculated to determine the cost of a proposed change in the clock tree. Not having to recalculate the rest of the tree greatly reduces the computational complexity and time required for the process, allowing the required iterations to be completed in a much shorter time period.

19 Claims, 4 Drawing Sheets

METHOD FOR CLOCK SKEW COST CALCULATION

BACKGROUND OF THE INVENTION

1. Technical Field

This invention generally relates to clock circuits in electronic systems, and more specifically relates to a method for clock skew cost calculation.

2. Background Art

Minimization of skew in clock networks is a very important part of high-performance VLSI chip design. The clock networks are typically called trees, and the places where the clock signals are to be used on the device are typically called sinks. In the simple case where all clock signals are to arrive at the same time, the clock skew of a sink is defined as the difference between the arrival time of the clock signal at that sink and the mean time of arrival at all sinks. In other cases the clocks might be required to arrive at different sinks with a specified relative arrival time. For example, the design might require that the clock arrive at a first sink 170 picoseconds after it arrives at a second sink. This can be made equivalent to the simple case by adding an artificial delay at all sinks except for that with the latest desired relative arrival time, such that the arrival times with these artificial delays included should all be equal. In the above-mentioned example, an artificial delay of 170 picoseconds would be added at the second sink. Thus, the clock skew of a sink would again be the difference between the arrival time of that sink and the mean arrival time, with the appropriate artificial delays added.

Because a change to the clock tree will, in general, alter the mean clock arrival time, a recalculation of clock skew after a change in the clock tree requires recalculation of the clock skew across the entire tree. Many methods of skew minimization use a cost analysis of proposed changes in a clock tree, where the cost is some composite measure of the skew for all sinks, e.g., the sum of the skews for all sinks. Known methods for computing such a cost function require computation of the skew at each sink whenever that skew changes. Since the skew of each sink depends on the mean arrival time at all sinks, and that mean is affected by a change in the arrival time at any sink, these methods require recomputing the skew at all sinks whenever the arrival time at any sink changes.

Other known methods would make use of the fact that a change in the arrival time of a single clock sink has only a small effect on the mean arrival time at all sinks. These methods would treat the mean as a constant, and thus would require recomputing the skew only for those sinks whose arrival times change. These methods accumulate error after a series of changes are made. A periodic recomputation of all skews whenever the change in the mean exceeds some value can reduce this error, but this periodic recomputation is itself costly. These methods also do not deal well with changes in the clock tree which affect a large number of sink arrival times (such as changes near the root of the clock tree), and which may therefore cause significant changes in the mean arrival time.

It is generally desirable to move a clock sink's arrival time toward a mean of sink arrival times, and many definitions of cost take that into account. Thus, to measure the cost in this way you must measure the skew of all clock sinks, including the changes due to the proposed change.

Methods of skew minimization require repeatedly proposing a change to the clock tree, evaluating the cost of the change, and accepting or rejecting the change based upon that cost. The entire process is then repeated until the desired clock skew is achieved, possibly requiring 100 million iterations. These methods are typically referred to as clock skew optimization routines.

In some past methods, each iteration has required computing the cost effects of a proposed change across the entire clock tree. This process is itself very time consuming because a typical tree could have as many as 10,000 clock sinks. Given the large number of iterations typically required it is very deskable to minimize the computation required to compute the cost effect of a proposed clock tree change.

Therefore, there existed a need to provide a quick, accurate and efficient method for recalculating the cost of a proposed change in a clock tree structure in the context of a clock skew optimization process.

DISCLOSURE OF INVENTION

The present invention provides a method of computing the cost of a proposed clock tree change in the context of a clock skew optimization routine. One example of such an optimization routine is called simulated, which is well known in the art. For a general discussion of simulated annealing see "Optimization by Simulated Annealing," S. Kirkpatrick, C. D. Gelatt, and M. P. Vecchi, Science Volume 220, Page 671–680 (May 1983). According to the present invention, a recalculation of the clock skew cost due to a proposed change in the clock tree can be done without having to recompute the effect of the change to all of the sinks of that clock tree.

A typical clock tree comprises a clock source, or "root" and many clock sinks, or "leaves." The interconnection points in the clock tree are called "nodes."

The method is as follows: Initially, the parameters of a clock tree are computed and stored. These parameters include the clock skew of each leaf in the clock tree. First, a delay change is selected. The delay change either increases or decreases the delay between any two nodes on the tree, the second node being the delayed node. Second, any unpropagated incremental changes currently stored in the ancestors of the delayed node are propagated down to the delayed node. Third, the parameters of the delayed node are updated for the effects of the proposed change. Fourth, the effects of the proposed change are distributed up to the root of the clock tree. Fifth, the cost of the proposed delay change to the clock skew is then computed.

In this method only the parameters of the ancestors of the delayed node need to be recalculated to determine the cost of a proposed change in the clock tree. Not having to recalculate the rest of the tree greatly reduces the computational complexity and time required for the process, allowing the required iterations to be completed in a much shorter time period.

The foregoing and other objects, features and advantages of the invention will be apparent from the following more particular description of preferred embodiments of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

Figure 1:
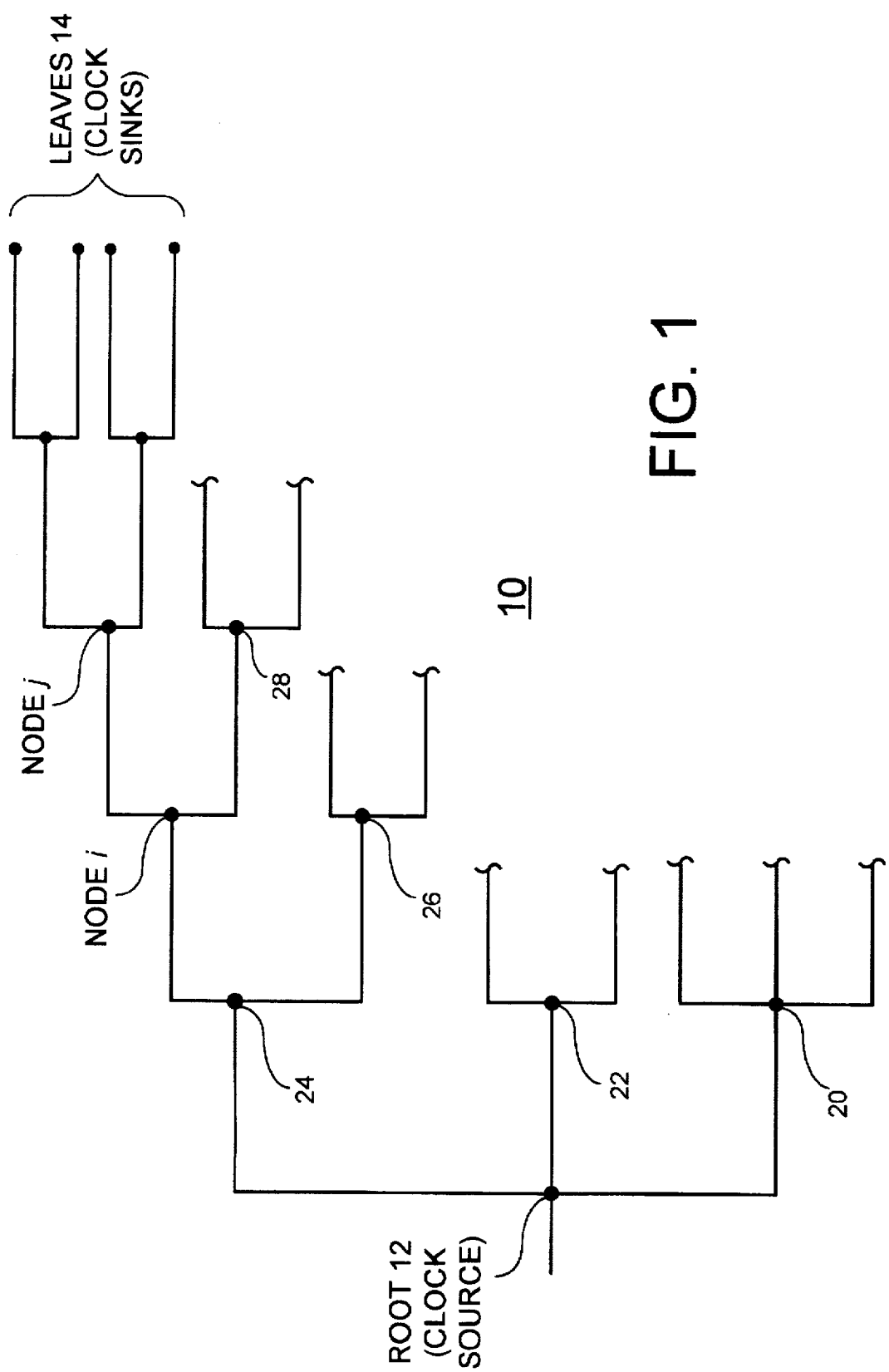
FIG. 1 is a schematic representation of a clock tree.

The method provided allows for recalculating the cost of a proposed delay change without having to recompute the parameters for the entire clock tree. Turning now to FIG. 1, FIG. 1 is a representative view of a clock tree 10. The clock tree 10 is a representation of a clock tree typically found on a VLSI device, except that on a VLSI device the clock tree 10 would be much larger, easily feeding in excess of 10,000 different clock sinks. In a broader sense, clock tree 10 may represent the clock tree in any electronic system, including the clock tree between devices (e.g., VLSI devices) and between printed circuit boards in a computer system.

The clock tree 10 has a root 12. Root 12 serves as the source of the clock signal for the VLSI device. The clock signal propagates through clock tree 10 to the clock sinks, places where the clock is to be used by the device, called leaves. For clarity purposes, FIG. 1 shows only a portion of the tree extended to the leaves, those leaves being leaves 14.

Clock tree 10 has a plurality of nodes, such as root 12, other junctions where the clock tree splits into different branches (e.g., 24, 26) and leaves 14, the leaves 14 called leaf nodes. For example, along the branches of clock tree 10 to shown leaves 14 are nodes i and j. Node i is the parent of node j and likewise node j is the child of node i. Node 28 is also a child of node i, and is a sibling of node j. All nodes up the tree from node j to root 12, including root 12 and the parent node i, are ancestors of node j. Likewise, all nodes down from node j to leaves 14, and including leaves 14, are descendants of node j.

Clock signals propagate from root 12 to the leaves. The propagation time from root 12 to a node is the root-to-node path delay of that node. The root-to-node path delay of a node k is represented by $\tau_k$. Therefore, the root-to-node path delay of node j is $\tau_j$.

The portion of the root-to-node path delay $\tau_j$ due to the branch between node i and node j is represented by $d_{ij}$. A change in the path delay $d_{ij}$ is represented by $\delta$.

The number of leaves fed through a particular node k is represented by $n_k$. Therefore, the value $n_j$ for FIG. 1 equals four, the number of leaves 14 fed through node j. The sum of all root-to-leaf path delays for all leaves fed through a node k is represented by $T_k$, where $T_k$ is defined as:

$$T_k = \Sigma \, \tau_{leaf}$$

for all leaves fed through node k. (1)

The sum of the squares of all root-to-leaf path delays for all leaves fed through node k is represented by $S_k$, where $S_k$ equals:

$$S_k = \Sigma \, \tau_{leaf}^2$$

for all leaves fed through node k. (2)

Using these definitions, if node k is a leaf node then $T_k=\tau_k$ and $S_k=\tau_k^2$.

$T_k$, $S_k$, $n_k$ and $\tau_k$ all represent important parameters of the clock tree and will be used in the disclosed method to compute the cost of a proposed change in the clock tree.

In the present invention, another parameter, $X_k$, representing the unpropagated effects of past delay changes, will also be used. $X_k$ is used to store the effects of past changes made to the clock tree that affect the children of node k, but have not yet been propagated to and used to update the node values of those children. This will be discussed further in relation to FIG. 4.

Figure 2:
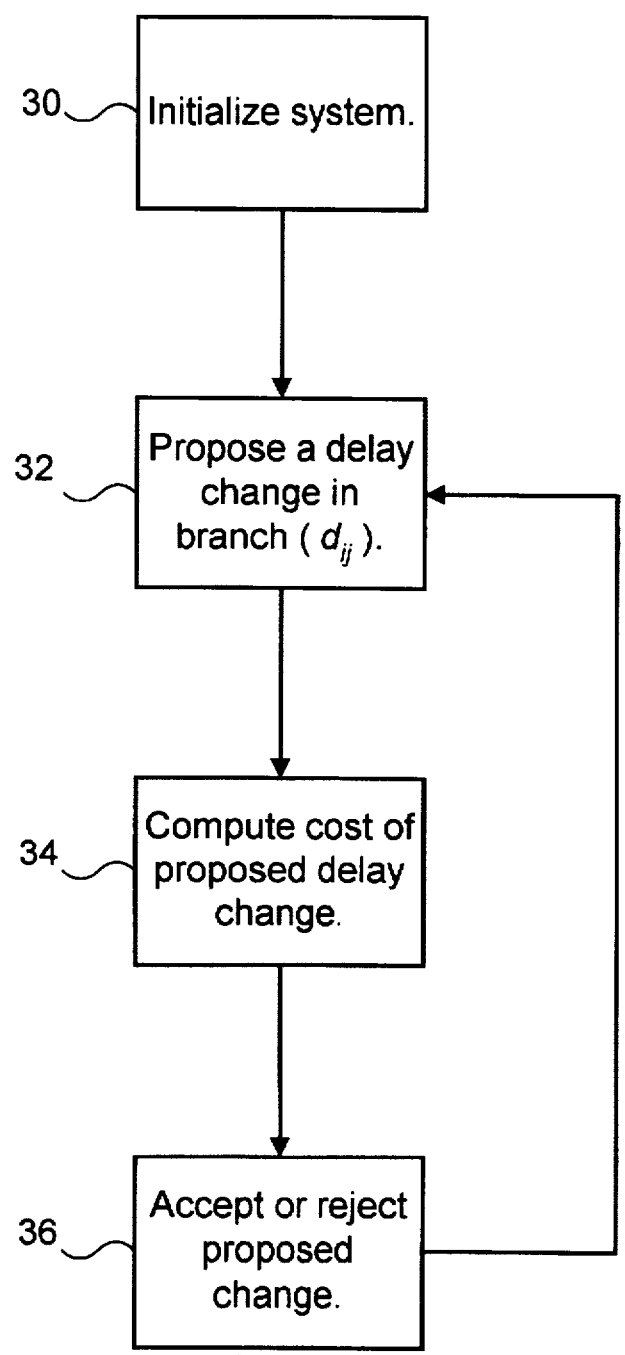
FIG. 2 is a flow diagram illustrating a generalized clock skew optimization method in accordance with the present invention.

Turning now to FIG. 2, FIG. 2 is a flow diagram illustrating a generalized clock skew optimization method. The first step 30 in the clock skew optimization method is to initialize the system. Initializing the systems typically involves calculating and storing the parameters of the clock tree. These may parameters include $T_k$, $S_k$, $n_k$ and $X_k$ for all nodes. The step of initializing the system will be discussed in greater detail with reference to FIG. 3.

The next step 32 is proposing a change $\delta$ in a branch delay $d_{ij}$. This step will be discussed in more detail in relation to FIG. 4.

The next step 34 is to compute the cost of the proposed delay change $\delta$. In prior methods, this would require recalculating the parameters of the entire clock tree. In the present invention, the cost is computed in a more efficient manner. The process used as part of the present invention will be discussed in greater detail in conjunction with FIG. 4.

The next step 36 involves accepting or rejecting the proposed change $\delta$ based upon the computed cost of that change.

Finally, the steps of proposing a delay change, computing the cost of the proposed delay change, and accepting or rejecting that proposed change in successive iterations is done until the desired level of clock skew minimization is achieved. In a typical clock tree, many millions of iterations will be required.

Figure 3:
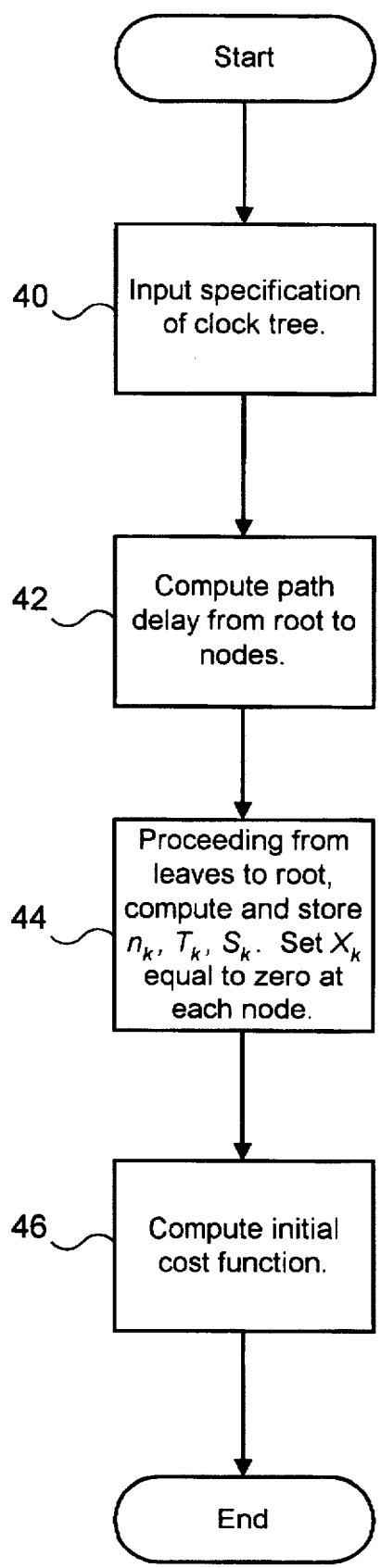
FIG. 3 is a flow diagram illustrating an initialization method in accordance with the present invention.

Turning now to FIG. 3, FIG. 3 is a flow diagram illustrating a suitable initialization method corresponding to step 30 of FIG. 1. This initialization method provides the basis for an improved fast and efficient skew cost analysis for proposed delay change $\delta$. The first step 40 is to input the physical specification of the clock tree. Typically, a design representation of the clock tree is stored in the computer being used to compute the clock skew. The design representation will typically include the layout, conductivity, and other details that will affect the timing of signals on the clock tree.

The next step 42 is to compute and store the root-to-node path delay $\tau_k$ for each node k. Typically, this is done by computing the delay between branches and proceeding from the root to the leaves, adding the delay of the branch feeding each node k to the $\tau_i$ of it's parent node i to determine the total root-to-node delay $\tau_k$ for the node k. The $\tau_{root}$ is zero. The individual branch delays are computed using a variety of well known methods, including circuit simulation, the use of precomputed tables of delays, or equation based computation.

The next step 44 is to compute and store an initial $n_k$, $T_k$ and $S_k$ for each node. As defined previously, $T_k$ equals the sum of all root-to-leaf path delays $\tau_k$ for all leaves fed through a node k. Likewise, $S_k$ equals the sum of the squares of all root-to-leaf path delays $\tau_k$ for all leaves fed through node k. Also, $n_k$ is the number of leaves fed through node k. These values are computed, proceeding from the leaves to the root. For the nodes k that are leaves, $n_k=1$, $T_k=\tau_k$ and $S_k=\tau_k^2$. For other nodes k, the values are computed by summing the values of n, T and S for all children of node k. At this point, the stored $\tau_k$ is no longer needed and can be discarded.

For each node, a variable $X_k$ is also to be stored. $X_k$ will represent the effects of changes made in the ancestors of node k that have not yet been propagated down to the children of node k. In the initialization stage, the value for $X_k$ is set to zero for each node k.

The next step 46 is to compute the initial clock skew cost function C. While several types of skew cost functions can be used, one preferred method defines the skew cost C as:

$$C = \sum_{k}^{leaves} (\tau_k - \bar{\tau})^2 = S_{root} = \frac{T_{root}^2}{n_{root}} \quad (3)$$

This definition of the cost highlights the effects of leaves that have a high clock skew by squaring the difference in path delay with the average path delay. This definition also allows the computation of the clock skew cost in accordance with the method of the present invention.

Figure 4:
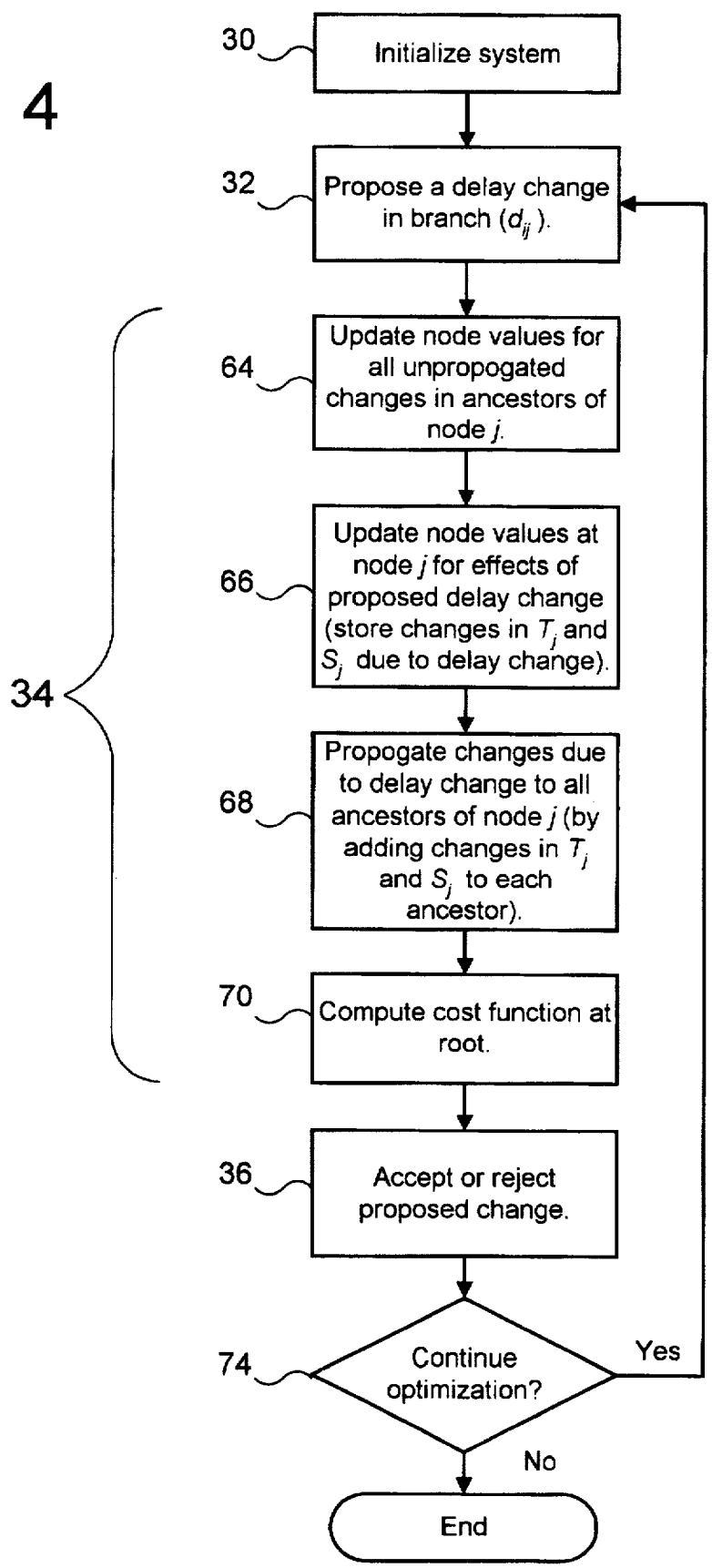
FIG. 4 is a flow diagram illustrating a detailed clock skew cost optimization method in accordance with the present invention.

Turning now to FIG. 4. FIG. 4 is a flow diagram illustrating a clock skew optimization method. The first step 30 is to initialize the skew computation system, as described in conjunction with FIGS. 2 and 3. The key is that the specification for the clock tree, including values for $T_k$, $S_k$, $X_k$ and $n_k$ for each node, are stored in a computation device such as a computer.

The next step 32 is to propose a change $\delta$ in the clock tree. As an example, the change could be made in the delay $d_{ij}$ between node i and node j of FIG. 1. In that case, node j is the delayed node for the proposed change $\delta$. The change could be a result of a change in logic, a modification of the net list, a change in the dimension of connections, or a change in the placement of elements. The change is made with the goal of improving the clock skew. One such way is to simply make a proposed change that will move a particular node toward the mean. Another, preferred method, used in simulated annealing optimization routines, is to simply select a change randomly.

The next step 64 is to update the stored node values for all unpropagated changes $X_k$ in the ancestors of the delayed node, which is in the case of FIG. 1, node j. This step is required because the preferred method stores the effects of past delay changes as unpropagated incremental changes until future changes make it necessary to propagate those changes. The storage of unpropagated incremental changes will be discussed further in relation to step 66.

In this case, the delay change proposed in step 32 makes it necessary to propagate those changes. Thus, for each ancestor of node j having a non-zero value of $X_k$, starting with the root and progressing down toward node j, update $X_k$ for all children of that ancestor node. This is done by first adding the $X_k$ of the parent, $X_{parent}$, to the $X_k$ of the children, $X_{child}$, for each of the children of the parent node. To begin the root is the parent node, so if $X_{root}$ is non-zero, then $X_{root}$ is added to $X_{child}$ for the each of the children of the root. Next, the $X_{parent}$ is used to update the other node values for each of the children, $T_{child}$ and $S_{child}$. This is done by calculating a new value for $T_{child}$(New $T_{child}$) using the previously stored value for $T_{child}$(Old $T_{child}$), and by calculating a new value for $S_{child}$(New $S_{child}$) using the previously stored value for $S_{child}$(Old $S_{child}$). This calculation is done using the relationships:

$$\text{New } T_{child} = \text{Old } T_{child} + n_{child}X_{parent} \quad (4)$$

$$\text{New } S_{child} = \text{Old } S_{child} + 2 X_{parent} \text{ Old } T_{child} + n_{child}X_{parent}^2 \quad (5)$$

Again, this process begins at the root, so if the root has a non-zero value of $X_{root}$, then $X_{root}$ is used to update $T_{child}$ and $S_{child}$ for each of its children.

After $X_{parent}$ has been used to update the node parameters of its children, there are no longer any unpropagated changes so $X_{parent}$ is cleared to zero. When a parent node updates a child for non-zero values of $X_k$, it must update all its children. Otherwise, when $X_k$ is cleared to zero those children would not have stored the correct node values.

This process is then repeated down the tree until the node values of node j are updated for all the unpropagated changes in its ancestors. This final update includes the updating of $X_j$, which then contains the unpropagated changes, if any, that have not yet been used to update the children of node j.

Thus, step 64, as applied to the clock tree of FIG. 1 (where the proposed delay change is between nodes i and j), would be as follows: $X_{root}$ would be added to $X_{20}$, $X_{22}$ and $X_{24}$ for its children, nodes 20, 22 and 24. Then $X_{root}$ would be used to update $T_k$ and $S_k$ for nodes 20, 22 and 24 using the formulas for $T_{child}$ and $S_{child}$ above. After doing so, $X_{root}$ would be cleared to zero. Then, progressing down the tree toward node j, the updated $X_{24}$ for node 24 would be added to the $X_k$ of its children, node i and node 26. Next, the updated $X_{24}$ would be used to update the respective $T_k$ and $S_k$ of nodes i and 26. And finally, $X_{24}$ would be cleared to zero. Next, the updated $X_i$ would be added to the $X_k$ of its children, node j and node 28, and then the updated $X_i$ would be used to update $T_k$ and $S_k$ for node j and node 28. Next $X_i$ would be cleared to zero. This process has updated the delayed node, node j, parameters for all the unpropagated changes between itself and its root. This has the effect of updating the node j for any non-zero unpropagated changes in its ancestors.

This process did not require the updating of all the nodes on the clock tree. Specifically, the effects were propagated to nodes 20 and 22, but not any further down those branches. Instead, the effects were stored in $X_{20}$ and $X_{22}$ to be propagated up to their children if and only if needed in the future.

The next step 66 is to update the node values for the delayed node for the effects of the proposed delay change $\delta$. In the example of FIG. 1, node j is the delayed node, and the proposed delay change $\delta$ is in $d_{ij}$. The node j values are updated for the proposed delay change $\delta$ using the relationships:

$$T_{j \; updated} = T_j + n_j\delta \quad (6)$$

$$S_{j \; updated} = S_j + 2\delta T_{j \; old} + n_j\delta^2 \quad (7)$$

$$X_{j \; updated} = X_j + \delta \quad (8)$$

(Note that the $T_j$, $S_j$ and $X_j$ are new values that were computed in the previous step 64.)

$X_{j \; updated}$ stores the effects of the proposed change that have not been propagated to the children of j. Thus, the children of j do not need to be updated, and will not be updated unless it becomes necessary in later iterations of the optimization routine. At this point it is necessary to store the changes in $T_j$ and $S_j$, $\Delta T_j$ and $\Delta S_j$, due to the proposed delay change $\delta$. The $\Delta T_j$ and $\Delta S_j$ will be used later below.

The next step 68 is to propagate the effects of the delay change $\delta$ to the ancestors of node j. This is done by recalculating $T_k$ and $S_k$ for all the ancestors of node j by adding $\Delta T_j$ and $\Delta S_j$ to $T_k$ and $S_k$ for all the ancestors of node j, up to and including the values for $T_{root}$ and $S_{root}$.

Step 68, as applied to the clock tree of FIG. 1, is as follows: At the node i, recompute $T_i$ and $S_i$ for the effects of the delay change $\delta$ by adding the values of $\Delta T_j$ and $\Delta S_j$. Then update the $T_{24}$ and $S_{24}$ by adding the same $\Delta T_j$ and $\Delta S_j$ to each value. And finally, $T_{root}$ and $S_{root}$ are updated by adding $\Delta T_j$ and $\Delta S_j$ to each value respectively.

The next step 70 is to compute the new cost of the clock tree skew. The cost is computed using the relationship:

$$C = S_{root} - \frac{T_{root}^2}{n_{root}} \quad (9)$$

Since the last step updated the values of $T_{root}$ and $S_{root}$ for the proposed delay change δ, this new computation of the cost C takes into account the proposed delay change δ. The new cost can then be compared to the cost before the proposed change was made.

The next step 36 is to accept or reject the proposed delay change δ according to the change in skew cost computed in the previous step. Typically, a delay change δ will be accepted if it results in an improved skew cost. In the context of a simulated annealing optimization routine, a probability based upon the annealing temperature will exist that the change will be accepted even if it degrades the skew cost.

The next step 74 is to decide whether to continue the optimization process. In a simulated annealing optimization routine this decision would be determined by the annealing schedule using commonly known methods. In other optimization methods one might continue until no changes are possible that improve the clock skew beyond a predetermined threshold value.

Some delay changes in a clock tree structure will cause changes to the delays of multiple branches. For example, a change in the location of a particular node could affect its parent and child branches. As an example, in the clock tree of FIG. 1, such a location change could affect the delay along the branch from node 24 to node i in addition to affecting the delay along the branch from node i to node j and node i to node 28. In accordance with the present invention, the disclosed method could simply be repeated for each of the affected branches. Alternatively, the process can be done more quickly using the following method.

First, step 64, updating the node values for all unpropagated changes in the ancestors of a node, is performed for only the affected nodes farthest from the root, that is the "deepest" of the changed delay edges. Because updating the values of a node for unpropagated changes will cause the values of all its ancestors to be updated as well, this will cause all of the changed nodes to be updated.

Next, the process can combine step 66, updating the node values for the effects of the proposed change, with step 68, propagating the changes due to the proposed change to all the ancestors, for each of the changed nodes. Again, this process is begun at the deepest changed nodes. When the node values are updated at the deepest changed nodes, we propagate the changes only up to the next node, the changed nodes' parents. There we compute the changes due to its changed delay branch and add them to the changes propagated up from the deepest changed nodes. This process is then repeated, with the cumulative changes propagated to the next ancestor, until the last changed node is reached. After the node values for the last changed node (the "shallowest" changed node) have been updated, the cumulative changes are then propagated to the root in the standard method of step 68.

Some delay changes in a clock tree structure may involve the movement of some child node from one parent to another, a combination of pruning a branch from the tree and grafting it on somewhere else. This can be handled in much the same manner as that of the path delay change, except that during step 64, in which stored values of $X_k$ are propagated down from the root, we must also compute the $\tau_k$ for the parent node from which the branch is being moved and the parent node to which the branch is being moved, and add the difference between these values to the $X_k$ value for the child node of the branch being moved. Also, in step 66 and 68 we must update $n_k$ as well as $T_k$ and $S_k$, subtracting the values of these variables for the child of the branch being moved from the parent from which the branch is being moved and all its ancestors and adding them to the parent to which the branch is being moved and all its ancestors.

Other structural changes could include merging a child node into its parent, thereby making all nodes which were children of that child node children of its parent. Another change could include splitting a new child node out of its parent, thereby making some number of children of the parent node children of the new child node.

In the case of a child node being merged into its parent, we need only propagate pending changes in $X_k$ for the child node being moved down to its children so they will not be lost. In the case of a node being split from its parent, we need only compute the correct values of $T_k$, $S_k$ and $n_k$, for the new child node, these values being the sum of the respective values for the children of the new node.

Thus, the disclosed method allows for a quick and accurate calculation of the clock skew cost associated with a wide variety of delay changes to a clock tree. While the invention has been particularly shown and described with reference to preferred exemplary embodiments thereof, it will be understood by those skilled in the art that the foregoing and other changes in form and details may be made therein without departing from the spirit and scope of the invention.

I claim:

1. A method for determining a change in clock skew cost resulting from a delay change in a clock tree, said delay change affecting the delay to a delayed node, said clock tree comprising a root and a plurality of nodes, said plurality of nodes including a plurality of leaves, said plurality of nodes including ancestors and descendants in the clock tree, each of said plurality of nodes having an associated set of node values, the method comprising the steps of:
   a) propagating any stored unpropagated incremental changes in the ancestors of said delayed node, to said delayed node;
   b) updating said node values of said delayed node for effects of said proposed delay change;
   c) propagating effects of said proposed delay change to said root of said clock tree; and
   d) computing said change in clock skew cost based upon said propagated effects at said root of said clock tree.

2. The method of claim 1 wherein said proposed delay change is selected to move the clock skew of affected leaves toward a mean clock skew across said plurality of nodes in said clock tree.

3. The method of claim 1 wherein said proposed delay change is selected randomly.

4. The method of claim 1 wherein said clock skew cost C is defined as:

$$C = S_{root} - \frac{T_{root}^2}{n_{root}}$$

where $n_{root}$=number of leaves fed through said root, $T_{root}$= sum of all root-to-leaf path delays through said root and $S_{root}$=sum of squared root-to-leaf path delays through said root.

5. The method of claim 1 wherein said proposed delay change is accepted according to the change in clock skew cost, wherein said proposed delay change is accepted if it improves the clock skew cost, and wherein delay changes that degrade the cost clock skew cost are accepted according to a simulated annealing based probability.

6. The method of claim 1 wherein said proposed delay change is accepted if said change in clock skew cost improves the clock skew cost.

7. The method of claim 1 wherein said proposed delay change affects the delay along a plurality of branches, and wherein the step a) is completed for the deepest node affected by said proposed delay change, and wherein step b) and step c) are first completed for the deepest node affected by said proposed delay change, and wherein steps b) and c) are repeated up the tree until the shallowest node affected by the proposed delay change is reached.

8. A method for determining a change in a clock skew cost resulting from a proposed delay change in a clock network, said clock network arranged in a clock tree configuration, said clock tree configuration comprising a plurality of nodes, said plurality of nodes including a root and a plurality of leaves, said plurality of nodes including ancestors and descendants, said ancestors including a parent node, and said descendants including at least one child node, wherein nodes are siblings if they share the same parent, each of said plurality of nodes having an associated set of node values, wherein said proposed delay change affects the delay along a branch of said clock tree, said branch connecting a first node to a second node, with said first node being a ancestor to said second node, the method comprising the steps of:

a) distributing any stored unpropagated incremental changes in the ancestors of said second node, down to said second node;

b) updating said node values of said second node for effects of said proposed delay change;

c) propagating effects of said proposed delay change to said root of said clock tree; and d) computing said change in said clock skew cost based upon said propagated effects at said root of said clock tree.

9. The method of claim 8 wherein said node values include: number of leaves fed through said each node, sum of all root-to-leaf path delays through each said node, sum of squared root-to-leaf path delays through each said node, and unpropagated incremental changes of said each node.

10. The method of claim 8 wherein said proposed delay change is selected to move the clock skew of affected leaves toward a mean clock skew across said plurality of nodes in said clock tree.

11. The method of claim 8 wherein said proposed delay change is selected randomly.

12. The method of claim 8 wherein said clock skew cost C is defined as:

$$C = S_{root} - \frac{T_{root}^2}{n_{root}}$$

where $n_{root}$=number of leaves fed through said root, $T_{root}$= sum of all root-to-leaf path delays through said root and $S_{root}$=sum of squared root-to-leaf path delays through said root.

13. The method of claim 8 wherein said proposed delay change is accepted according to the change in said clock skew cost, wherein said proposed delay change is accepted if it improves the clock skew cost, and wherein delay changes that degrade the cost clock skew cost are accepted according to a simulated annealing based probability.

14. The method of claim 8 wherein said proposed delay change is accepted if said change in clock skew cost improves the clock skew cost.

15. The method of claim 8 wherein said proposed delay change affects the delay along a plurality of branches, and wherein the step a) is completed for the deepest node affected by said proposed delay change, and wherein step b) and step c) are first completed for the deepest node affected by said proposed delay change, and wherein steps b) and c) are repeated up the tree until the shallowest node affected by the proposed delay change is reached.

16. A method for optimizing clock skew of a clock network, said clock network arranged in a clock tree configuration, said clock tree comprising a plurality of nodes, said plurality of nodes including a root and a plurality of leaves, said plurality of nodes including ancestors and descendants, said ancestors including a parent node, and said descendants including at least one child node, wherein nodes are siblings if they share the same parent, each of said plurality of nodes having an associated set of node values, the method comprising the steps of:

a) storing said associated set of node values for each of said plurality of nodes, said associated set of node values including number of leaves fed through said each node, sum of all root-to-leaf path delays through said each node, sum of squared root-to-leaf path delays through said each node and unpropagated incremental changes of said each node;

b) selecting a delay change, said delay change effecting the delay along a branch of said clock tree, said branch connecting a first node to a second node, with said first node being parent to said second node;

c) updating said node values for each child of all ancestral nodes of said second node having any non-zero unpropagated incremental change, said updating commencing at nodes nearest said root of said clock tree, said updating to include the siblings of any child node that is updated;

e) updating said node values of said second node for said delay change, said updating resulting in a change in said node values of said second node;

f) storing said change in node values of said second node;

g) propagating effect of said delay change to all ancestors of said second node, starting at said first node and working towards said root, said step of propagating effect including use of said change in node values of said second node; and h) computing said change in clock skew cost based upon said propagated effects at said root of said clock tree.

17. The method of claim 16 wherein said proposed delay change is selected to move the clock skew of affected leaves toward a mean clock skew across said plurality of nodes in said clock tree.

18. The method of claim 16 wherein said proposed delay change is selected randomly and wherein said delay changes that degrade the cost clock skew cost are accepted according to a simulated annealing based probability.

19. The method of claim 16 wherein said clock skew cost C is defined as:

$$C = S_{root} - \frac{T_{root}^2}{n_{root}}$$

where $n_{root}$=number of leaves fed through said root, $T_{root}$= sum of all root-to-leaf path delays through said root and $S_{root}$=sum of squared root-to-leaf path delays through said root.

* * * * *

UNITED STATES PATENT AND TRADEMARK OFFICE
CERTIFICATE OF CORRECTION

PATENT NO.   : 5,740,067
DATED        : April 14, 1998
INVENTOR(S)  : Hathaway

It is certified that error appears in the above-indentified patent and that said Letters Patent is hereby corrected as shown below:

In Column 5, lines 12 through 14, the third equal sign (=) in the equation should read as a minus sign (-) as shown below:

$$C = \sum_{k}^{leaves} (\tau_k - \bar{\tau})^2 = S_{root} - \frac{T_{root}^2}{n_{root}} \qquad (3)$$

Signed and Sealed this

Twenty-eighth Day of July, 1998

Attest:

BRUCE LEHMAN

*Attesting Officer*           *Commissioner of Patents and Trademarks*